US008067691B2

(12) United States Patent
Puigcerver et al.

(10) Patent No.: US 8,067,691 B2
(45) Date of Patent: Nov. 29, 2011

(54) COVERS FOR POWER DISTRIBUTION LINE INSULATORS

(75) Inventors: Luis O. Puigcerver, Cary, NC (US); Laura J. Hiller, Cary, NC (US); David E. Bowling, Fuquay Varina, NC (US); Stephen M. Parker, Greensboro, NC (US); Sherif I. Kamel, Cary, NC (US); Charles H. Hillary, Vero Beach, FL (US)

(73) Assignee: Tyco Electronics Corporation, Middletown, PA (US)

( * ) Notice: Subject to any disclaimer, the term of this patent is extended or adjusted under 35 U.S.C. 154(b) by 337 days.

(21) Appl. No.: 12/409,729

(22) Filed: Mar. 24, 2009

(65) Prior Publication Data

US 2009/0236116 A1 Sep. 24, 2009

Related U.S. Application Data

(60) Provisional application No. 61/038,823, filed on Mar. 24, 2008.

(51) Int. Cl.
*H05K 5/03* (2006.01)

(52) U.S. Cl. ........................... 174/66; 174/172; 174/174

(58) Field of Classification Search .................. 174/172, 174/174
See application file for complete search history.

(56) References Cited

U.S. PATENT DOCUMENTS 1,825,228 A * 9/1931 Greenwood .................... 361/14
4,906,801 A * 3/1990 Beasley ........................ 174/5 R
5,525,073 A * 6/1996 Sampson ...................... 439/521
5,682,015 A * 10/1997 Harben ......................... 174/5 R
6,303,870 B1 * 10/2001 Nazaryan et al. ............. 174/172
6,730,852 B1 * 5/2004 Puigcerver et al. ........ 174/138 F
7,154,034 B2 * 12/2006 Lynch ........................... 174/5 R
7,297,869 B2 * 11/2007 Hiller et al. ................. 174/40 R
7,622,668 B1 * 11/2009 Tollefson et al. ............. 174/5 R

OTHER PUBLICATIONS

Tyco Electronics, Insulation and protection Enhancing the reliability of overhead power systems. Energy Division http://energy.tycoelectronics.com, 8 pages; Apr. 2003.
Tyco Electronics, MVLC Raychem medium voltage line cover. Energy Division http://energy.tycoelectronics.com, 2 pages; Jan. 2008.

* cited by examiner

*Primary Examiner* — Timothy Thompson
*Assistant Examiner* — Hiram E Gonzalez
(74) *Attorney, Agent, or Firm* — Myers Bigel Sibley & Sajovec

(57) ABSTRACT

A cover is provided for acute angled insulator pair arrangement, such as a V-switch. The insulator pair arrangement includes a first insulator and a second insulator, the insulators extending relative to each other at an acute angle from first ends thereof. The cover includes a first cover member and a second cover member. The second cover member is configured to mate with the first cover member to define an enclosure that encloses the first ends of the insulators and a region therebetween. The enclosure extends to a position proximate an end skirt of each of the insulators closest to the first ends thereof without extending over the end skirts.

21 Claims, 6 Drawing Sheets

COVERS FOR POWER DISTRIBUTION LINE INSULATORS

RELATED APPLICATIONS

This application claims priority to U.S. Provisional Application Ser. No. 61/038,823 filed Mar. 24, 2008, the disclosure of which is hereby incorporated by reference in its entirety.

FIELD OF THE INVENTION

The present invention relates to protective covers and, more particularly, to protective covers for insulators for power distribution lines.

BACKGROUND OF THE INVENTION

Support structures, busbars, are often used to suspend/support insulators and Medium voltage connections. These support structures are generally located outdoors and may be of a variety of different configurations to suspend one or more connections. One problem with busbar, particularly with power substations at medium voltages, is that birds or other animals may land or climb onto the structure. Such contact by animals, particularly adjacent the support structure, may cause a short or electrical flash-over allowing current flow through the animal, which may cause a power outage or other problem with the power system.

For example, it is known that birds from time to time perch on support structures such as substation support structures. For certain birds, their wing span is great enough to contact two parallel lines or otherwise create an electrical flashover during take off or landing. In addition, to harming the bird, such an electrical flashover can also cause a power outage or other problem with the power distribution system.

Some configurations of support structures for substations, such as a V-switch, include two insulators that are coupled to the supporting ground bus structure in a manner that leaves the ends of the insulators proximate the ground bus structure in relatively close proximity to each other. Such an arrangement may be problematic for conventional covers, which may interfere with each other and/or create a leakage path for the insulators. As a result, for example, a V-switch containing the insulators may undesirably still conduct current when the switch has been opened.

SUMMARY OF EMBODIMENTS OF THE INVENTION

According to embodiments of the present invention, a cover is provided for acute angled insulator pair arrangement, such as a V-switch. The insulator pair arrangement includes a first insulator and a second insulator, the insulators extending relative to each other at an acute angle from first ends thereof. The cover includes a first cover member and a second cover member. The second cover member is configured to mate with the first cover member to define an enclosure that encloses the first ends of the insulators and a region therebetween. The enclosure extends to a position proximate an end skirt of each of the insulators closest to the first ends thereof without extending over the end skirts.

In further embodiments, the enclosure includes an interface chamber. A first insulator receiving passageway extends from a first edge of the enclosure to the interface chamber. A second insulator receiving passageway extends from a second edge of the enclosure to the interface chamber. The second insulator receiving passageway extends from the interface chamber at an angle relative to the first insulator receiving passageway corresponding to the angle at which the insulators extend from the first ends thereof.

In other embodiments, the first insulator receiving passageway has a diameter and a length selected to define a mating surface at an end thereof opposite the interface chamber that is located proximate the end skirt of the first insulator and extends substantially conformally around an outer surface thereof when the cover is mounted on the insulator pair arrangement. The second insulator receiving passageway has a diameter and a length selected to define a mating surface at an end thereof opposite the interface chamber that is located proximate the end skirt of the second insulator and extends substantially conformally around an outer surface thereof when the cover is mounted on the insulator pair arrangement.

In further embodiments, the cover further includes a mounting member receiving opening on a third edge of the enclosure, opposite the first and second edges. The mounting member receiving opening is configured to receive an interface member coupled to the first ends of the insulators positioned in the interface chamber when the cover is mounted on the insulator pair arrangement. A mounting member mating flange may extend from the mounting member receiving opening that is configured to matingly receive a support member. The interface member is coupled to the support member. The support member may be a ground bus bar.

In yet other embodiments, the enclosure further includes a connecting flange on each of the first and second cover members extending around a portion of a periphery of the enclosure. The connecting flanges may extend between the first and second insulator receiving passageways, between the first insulator receiving passageway and the mounting member receiving opening and/or between the second insulator receiving passageway and the mounting member receiving opening. Aligned connector receiving openings are in the connecting flanges of the cover members that are configured to receive a connector member therethrough to connect the first and second cover members in a closed position defining the enclosure. A plurality of aligned connecting receiving openings may be provided in each connecting flange.

In further embodiments, the first cover and the second cover are mirror image structures, each of which defines substantially half of the enclosure, half of the first insulator receiving passageway, half of the second insulator receiving passageway and half of the mounting member receiving opening. The first and second cover members may be a track resistant, insulating grade, ultra-violet (UV) stable polymer. The first and second cover may be unitarily molded covers.

In yet other embodiments, an insulator pair arrangement is providing including a cover as described above and the first insulator and the second insulator. The enclosure may be positioned around the insulator pair arrangement. The arrangement may further include the interface member with the first ends of the insulators coupled thereto and the support member with the interface member coupled thereto and the enclosure may be positioned around the insulator pair arrangement with the interface member in the interface chamber.

In further embodiments, the first and second cover members are configured to mate with an air gap therebetween. A plurality of nubs may be provided on an opposing face of the first cover member and/or the second cover member sized to provide a selected width of the air gap therebetween.

DETAILED DESCRIPTION OF EMBODIMENTS OF THE INVENTION

Figure 1:
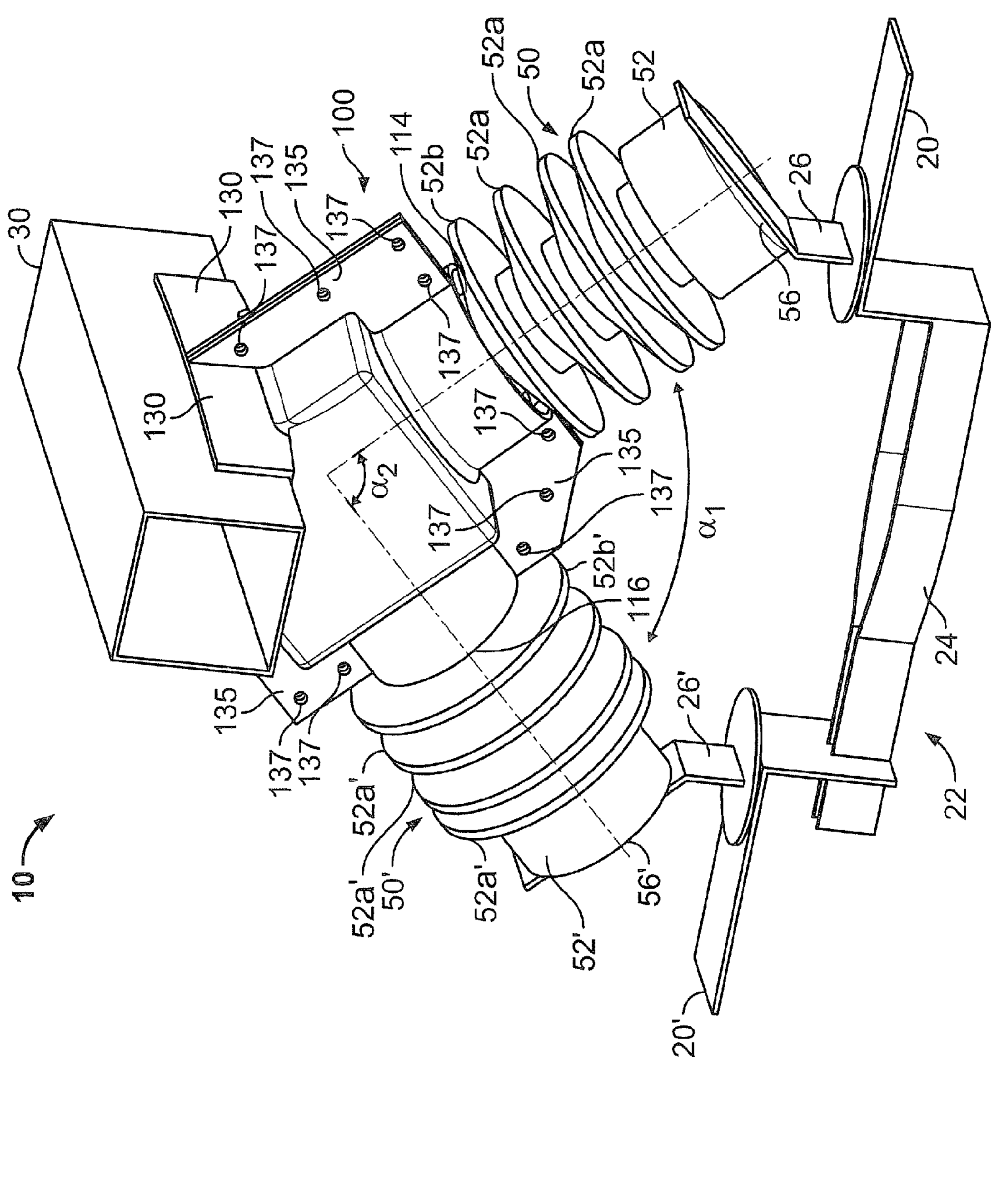
FIG. 1 is a perspective view of an acute angled insulator pair arrangement with a cover positioned thereon according to some embodiments of the present invention.

The present invention now will be described more fully hereinafter with reference to the accompanying drawings, in which illustrative embodiments of the invention are shown, In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention may be used with power distribution systems in areas such as substation asset protection. As will be described further herein, some embodiments of the present invention provide a two-piece, non-tracking, V-Switch cover designed to fit over typical V-Switch equipment in substations. The cover may be preformed and shaped to fit easily around the equipment and may be held together with conventional latches. In such applications, the V-Switch cover may limit or prevent animal and raptor (or other bird) caused outages on the equipment while also limiting or preventing the ability of birds to nest in spaces associated with the typical V-Switch equipment. Such a preformed animal protection cover may advantageously provide convenient protection in equipment configurations where conventional squirrel guard and the like may be undesirable. For example, a conventional squirrel guard may normally extend a significant distance horizontally from an insulator to which it is mounted. In an acute angled positioning of a pair of inductors, such as with a V-Switch, such covers may suffer from mechanical interference and contact related increased risks of leakage current flow by the insulator. Particular embodiments will be described and illustrated herein in which the cover is applied to a V-Switch arrangement hung from a ground plane structure, such a bus bar.

Figure 2:
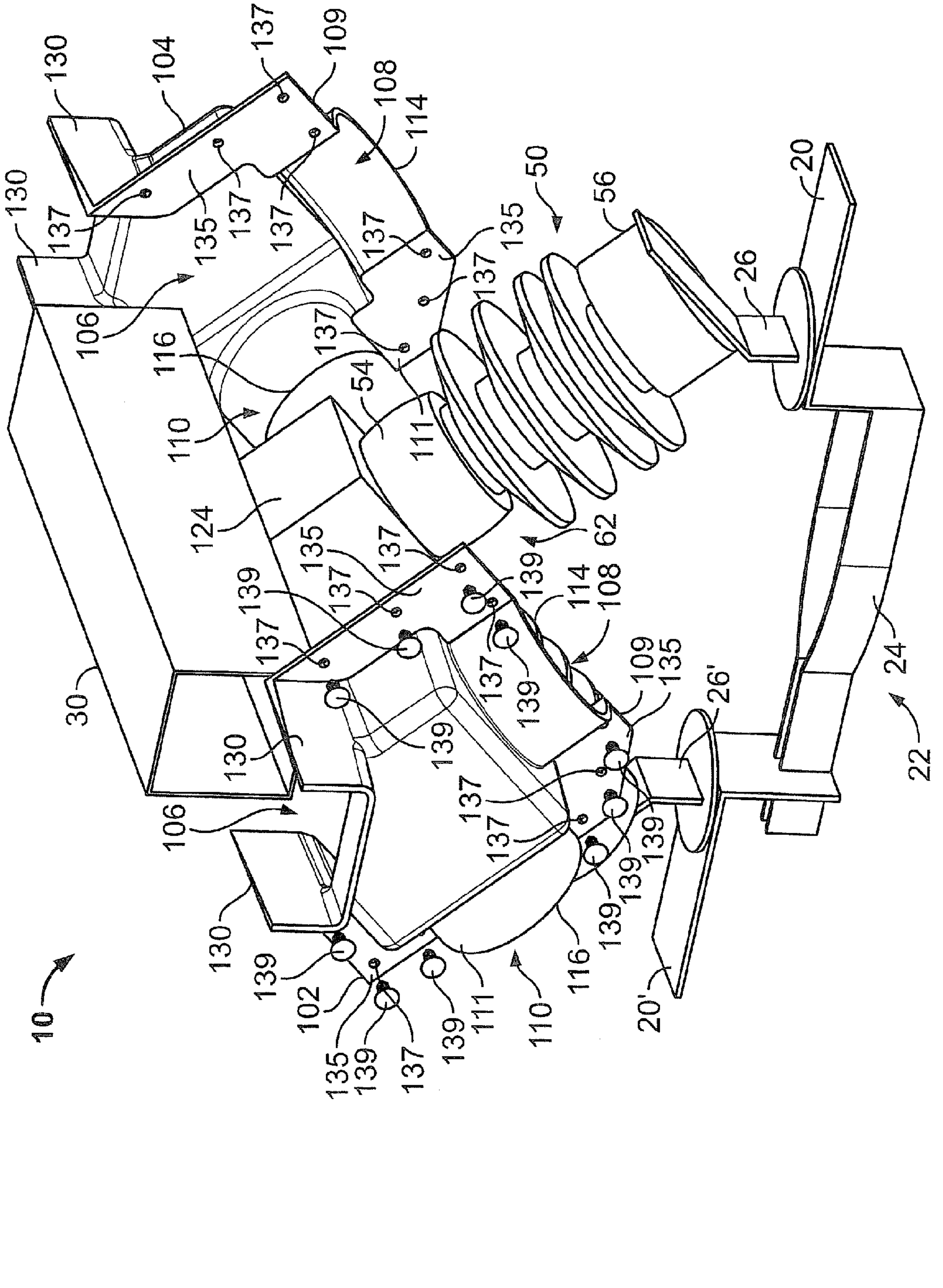
FIG. 2 is an exploded perspective view of the acute angled insulator pair arrangement of FIG. 1.
Figure 3:
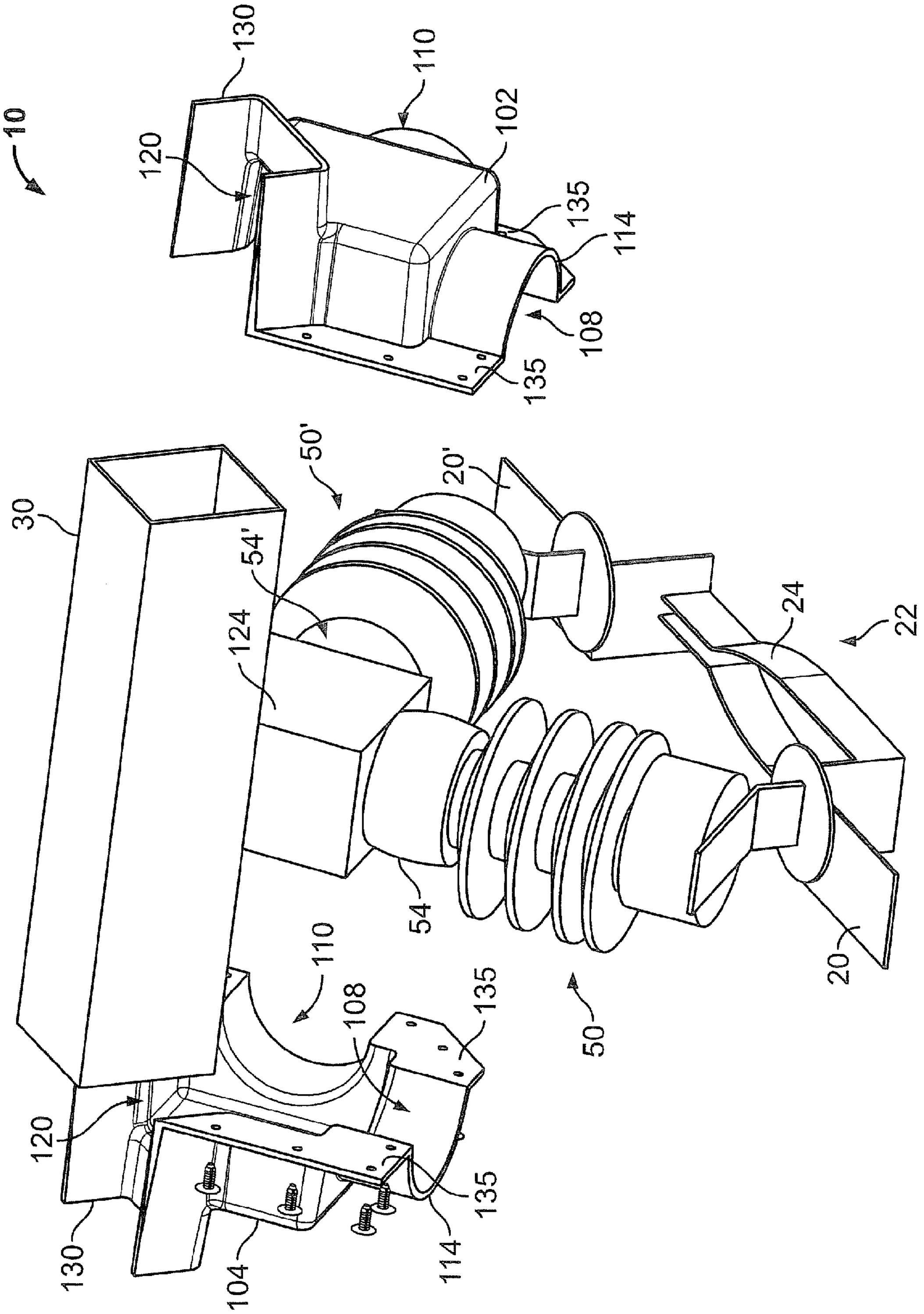
FIG. 3 is an exploded perspective view of the acute angled insulator pair arrangement of FIG. 1.

Embodiments of the present invention will now be described with reference to FIGS. 1-7. With reference to FIGS. 1-7, a protective cover 100 according to embodiments of the invention is shown mounted on a V-switch type acute angled insulator pair arrangement (V-switch) 10. The V-switch 10 includes a pair of insulators 50, 50' extending relative to each other at an acute angle $\alpha_1$ from first ends 54, 54' thereof. The first ends 54, 54' of the insulators 50, 50' are mounted on a support member 30, shown as a bus bar 30 in the figures. As best seen in FIGS. 2-3 the first ends 54, 54' of the insulators 50, 50' may be mounted to the support member 30 through an interface member 124 coupled to the support member 30.

Electrical conductors 20, 20' extend from respective ends of a switch 22 mounted to second ends 56, 56' of the insulators 50, 50' through respective mounting members insulators 26, 26'. The conductors 20, 20' may be operatively electrically and mechanically connected to the insulators 50, 50' in any suitable manner, such mounting methods. The switch 22 is illustrated as including a switch bar 24 that selectively electrically connects the conductors 20, 20'. The switch 22 may operate in a manner that is well-known to those of skill in the art.

The illustrated insulators 50, 50' each include an insulator body 52, 52' having alternating core segments with skirts **52*b*, 52*b*' that extend radially outwardly from the core segments. The insulator body 52, 52'** may be formed of a polymer or a ceramic, for example.

Turning to the protective cover 100 in more detail, the protective cover 100 includes a first cover member 102 and a second cover member 104. In the closed position illustrated in FIG. 1, the second cover 104 mates with the first cover 102 to define an enclosure that encloses the first ends 54, 54' of the insulators 50, 50' and a region 62 therebetween. The enclosure extends to a position proximate the end skirt 52*b*, 52*b*' of each of the insulators 50, 50' that is closest to the first ends 54, 54' thereof without extending over the end skirts 52*b*, 52*b*'. Such a limited length may decrease the likelihood of leakage current generation as, even though such intentional contact between protective covers on adjacent insulators is generally considered undesirable, the limited length of extension of the illustrated covers along the length of the insulators may reduce the potential for related leakage current problems becoming problematic in operation of the V-Switch.

As illustrated in FIGS. 1-4, the first cover 102 and the second cover 104 are mirror image structures, each of which defines substantially half of the enclosure, half of a first insulator receiving passageway 108, half of a second insulator receiving passageway 110 and half of a mounting member receiving opening 120.

Figure 4:
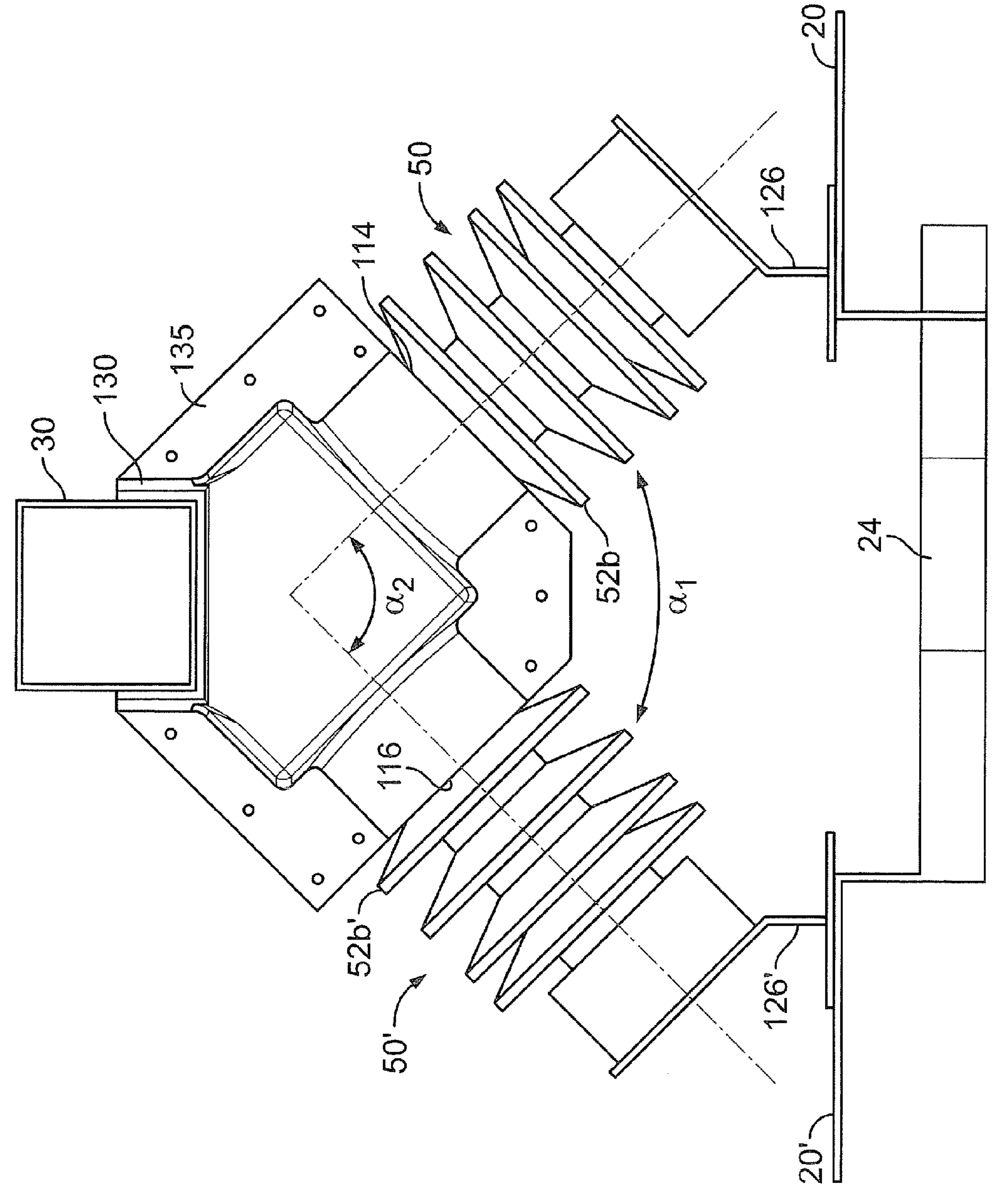
FIG. 4 is a top plain view of the acute angled insulator pair arrangement of FIG. 1.

In the illustrated embodiments, the enclosure defined by the cover members 102, 104 includes an interface chamber 106 and the first and second insulator receiving passageways 108, 110. The first insulator receiving passageway 108 extends from a first edge 109 of the enclosure to the interface chamber 106. The second insulator receiving passageway 110 extends from a second edge 111 of the enclosure to the interface chamber 106. As seen in FIGS. 1 and 4, the second insulator receiving passageway 110 extends from the interface chamber 106 at an angle $\alpha_2$ relative to the first insulator receiving passageway 108 corresponding to the angle $\alpha_1$ at which the insulators 50, 50' extend from the first ends 54, 54' thereof.

Figure 5:
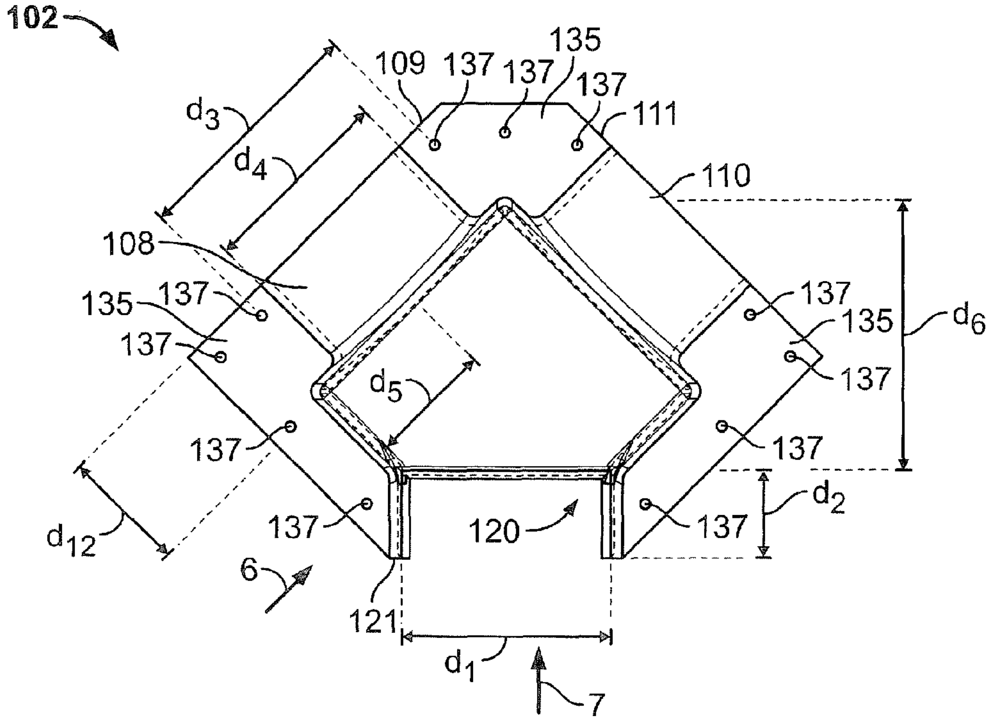
FIG. 5 is a top plain view of the cover member shown in the embodiments of FIG. 1.

As best seen in FIG. 5, the first insulator receiving passageway 108 has a diameter $d_3$ and a length $d_{12}$ that are selected to define a mating surface 114 (FIG. 1) at an end thereof opposite the interface chamber 106. The second insulator receiving passageway 110 is similarly scaled to define a mating surface 116 (FIG. 1) at an end thereof opposite the interface chamber 106. The mating surfaces 114, 116 are located proximate the respective end skirts 52*b*, 52*b*' on the insulators 50, 50' and extend substantially conformally around an outer surface thereof when the cover 100 is mounted on the insulator pair arrangement as seen in FIGS. 1 and 4. It will be understood that the respective passageways 108, 110 may be dimensioned to accommodate a specified range of variation in the angle $\alpha_1$ defined by the insulators 50, 50' when installing the covers 102, 104 in the field at substations or the like.

As seen in FIGS. 1-4, the cover 100 further includes a mounting member receiving opening 120 on a third edge 121 of the enclosure defined by the cover members 102, 104. The third edge 121 is opposite the first and second edges 109, 111 to accommodate the mechanical support connection of the insulator pair arrangement 50, 50' of the illustrated V-Switch. As such, the mounting member receiving opening 120 is configured to receive an interface member 124 coupled to the first ends 54, 54' of the insulators 50, 50' positioned in the interface chamber 106 and a support member 30 to which the insulators 50, 50' are coupled when the cover 100 is mounted on the insulator pair arrangement (V-Switch) 10. As shown in FIGS. 1-4, the support member 30 is a ground bus bar 30.

As best seen in FIGS. 2 and 3, the illustrated enclosure defined by the cover members 102, 104 also includes a connecting flange 135 on each of the first cover member 102 and the second cover member 104. The connecting flanges 135 each extend around a portion of a periphery of the enclosure. For the illustrated embodiments, the connecting flanges 135 extend between the first insulator receiving passageway 108 and the second insulator receiving passageway 110, between the first insulator receiving passageway 108 and the mounting member receiving opening 120 and between the second insulator receiving passageway 110 and the mounting member receiving opening 120. However, it will be understood that the connecting flange does not extend through each of these regions in some embodiments of the present invention. In addition, aligned connector receiving openings 137 are illustrated in the connecting flanges 135 of the cover members that are configured to receive a connector member 139 therethrough to connect the first cover member 102 and the second cover member 104 in a closed position defining the enclosure as seen in FIG. 1. More particularly, in the illustrated embodiments, a plurality of pairs of aligned connector receiving openings 137 are shown spaced around each of the regions of the connecting flanges 135. It will be understood, however, that other connecting means, such as a clamps, adhesives or the like, may be used to form an enclosure from the covers 102, 104.

Furthermore, in some embodiments, the respective covers 102, 104 may be a unitary assembly hingedly connected at edges thereof, for example, by a living hinge or the like. However, the use of two mirror image covers as illustrated in the figures may facilitate installation of the protective cover 100 on an angled insulator pair arrangement 10. It will be further understood that the respective covers 102, 104 may be identical parts that may be interchangeably used as the first cover 102 or the second cover 104 based on the orientation of application of the respective cover members (e.g., a feature of a respective cover associated with a first insulator receiving passageway 108 in one orientation may define half of a second insulator receiving passageway 110 in the other orientation.)

Figure 6:
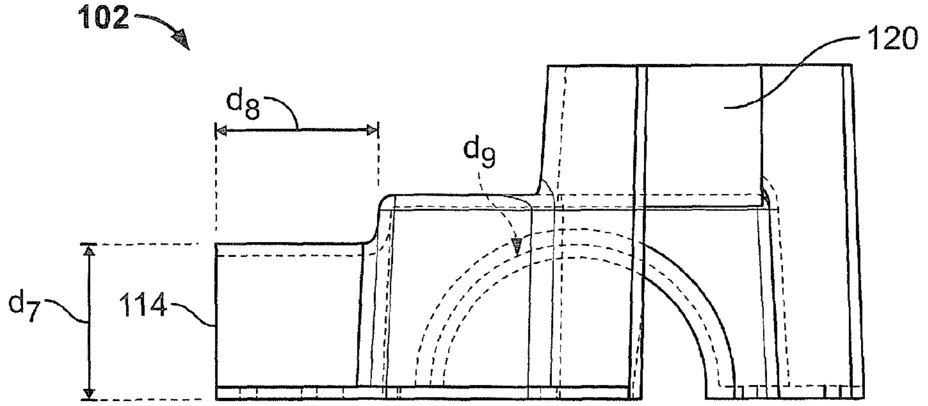
FIG. 6 is a side view of the cover of FIG. 5 from a direction 6 shown in FIG. 5.
Figure 7:
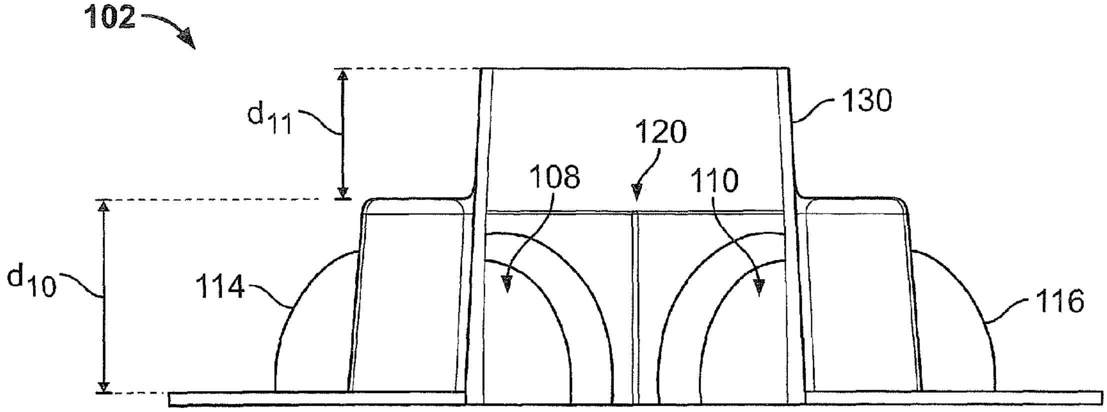
FIG. 7 is a side view of the cover of FIG. 5 is a direction 7 seen in FIG. 5.

Referring now to FIGS. 5-7, additional dimensional details of a cover 102 that may be used in some embodiments of the present invention will now be described. As shown in FIGS. 5-7, the mounting member receiving opening 120 has a dimension $d_1$. The dimension $d_1$ may be, for example, about 4.750 inches. A distance from a side wall of the enclosure to a center line of the insulator receiving passageways 108, 110 may be $d_5$ where, in some embodiments, $d_5$ is about 3.057 inches. A dimension $d_3$ of the length of the enclosure defining region of the cover may be, for example, about 6.114 inches and a dimension defining the diameter $d_4$ of the insulator receiving passageways 108, 110 may be, for example, about 4.50 inches. Also shown in FIG. 5, a dimension $d_6$ from the mounting member receiving opening 120 to a directly opposite end of the enclosure defining structure, where $d_6$ may be about 6.139 inches in some embodiments. A length $d_2$ of the mounting member mating flange 130 may be about 2.000 inches in some embodiments.

Referring now to FIG. 6, the dimension $d_8$ corresponds to dimension $d_{12}$ shown in FIG. 5. Dimension $d_7$ corresponds to half the diameter to the outer surface of the cover 102. which defines half of the receiving passageway 108 when mated with a corresponding second cover member 104. The dimension $d_7$ in some embodiments may be about 2.250 inches. As illustrated in FIG. 6, the half arc of the insulator receiving passageway may have a circumference of a dimension $d_9$, which may be about 4.50 inches in some embodiments. As seen in FIG. 7, a height $d_{10}$ of the enclosure defining portion of the cover 102 may be, in some embodiments, about 3.00 inches. The height $d_{11}$ of the mounting memory mating flange 130 corresponds to the dimension $d_2$ seen in FIG. 5.

As described above, the protective cover 100 may be used in combination with the first insulator 50 and the second insulator 50' to define an insulator pair arrangement. The insulator pair arrangement may further include the interface member 124 with the first ends 54, 54' of the insulators 50, 50' coupled thereto and the support member 30 with the interface member 124 coupled thereto. The covers 102, 104 can be mated to define the enclosure positioned around the insulator pair arrangement 50, 50' with the interface member 124 in the interface chamber 106 in the installed/closed position as seen in FIG. 1.

The cover 100 may be formed of any suitable material. According to some embodiments, the cover 100 is formed of a polymeric material. According to some embodiments, the cover 100 is formed of a track resistant, insulating grade, UV stable polymer. According to some embodiments, the cover 100 is unitarily molded. According to some embodiments, the cover 100 is unitarily injection molded.

Figure 8:
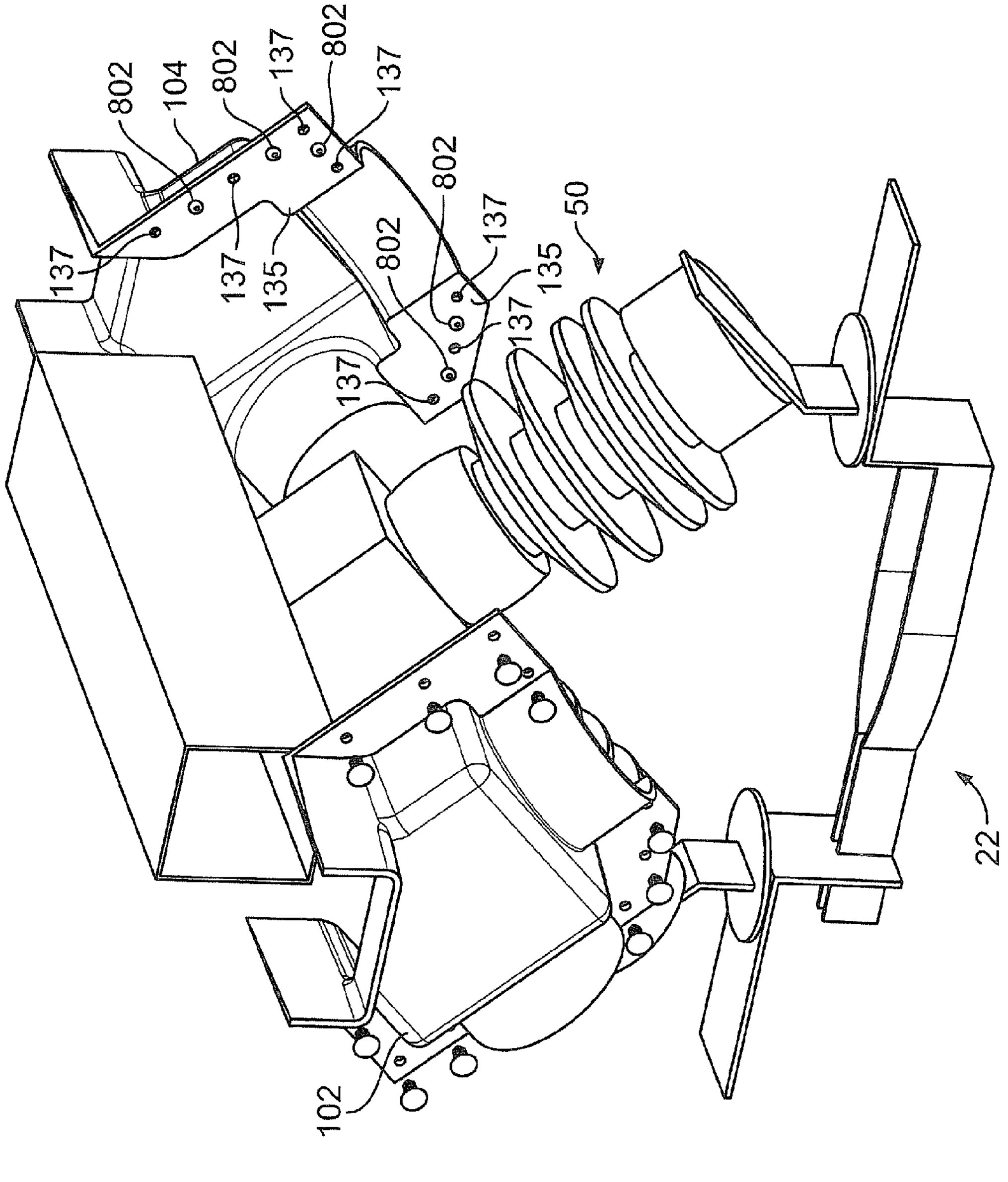
FIG. 8 is an exploded perspective view of an acute angled insulator pair arrangement according to further embodiments of the present invention.

In some embodiments, the first and second cover members 102, 104 are intentionally provided an air gap therebetween to accommodate an arc that may be generated across an insulator 50, 50' under some operating conditions (e.g., a lightening strike). Such an air gap may be selected to be sufficiently wide to accommodate the arc without damaging (e.g., burning) the cover members 102, 104 and sufficiently narrow to limit the risk that an animal could reach through the air gap into the region 62. In some embodiments the air gap may be between about 4 millimeters (mm) and about 8 mm. In some embodiments, the air gap may be provide by providing nubs (bumps) on facing surfaces of one or both of the cover members 102, 104. The shape of the nubs may be selected to facilitate the method used for forming the cover members 102, 104. For example, the cover members 102, 104 may be molded and the nubs may be rounded. As seen in the embodiments of FIG. 8, a plurality of rounded nubs 802 are provided on the connecting flanges 135 between ones of the receiving openings 137 on the cover member 104. Corresponding nubs 802 may also be provided on the connecting flanges 135 between ones of the receiving openings 137 on the cover member 102, which corresponding nubs 802 may be aligned or offset from the nubs 802 on the cover member 102 to provide a desired air gap width (i.e., if aligned, a total gap will be provided of twice the height of the nubs 802).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A cover for an acute angled insulator pair arrangement, the insulator pair arrangement including a first insulator and a second insulator, the insulators extending relative to each other at an acute angle from first ends thereof, the cover comprising:

a first cover member; and a second cover member configured to mate with the first cover member to define an enclosure that encloses the first ends of the insulators and a region therebetween, wherein the enclosure extends to a position proximate an end skirt of each of the insulators closest to the first ends thereof without extending over the end skirts and wherein the enclosure does not support the insulator pair arrangement.

2. The cover of claim 1, wherein the enclosure comprises:

an interface chamber;

a first insulator receiving passageway extending from a first edge of the enclosure to the interface chamber; and a second insulator receiving passageway extending from a second edge of the enclosure to the interface chamber, the second insulator receiving passageway extending from the interface chamber at an angle relative to the first insulator receiving passageway corresponding to the angle at which the insulators extend from the first ends thereof.

3. The cover of claim 2, wherein the first insulator receiving passageway has a diameter and a length selected to define a mating surface at an end thereof opposite the interface chamber that is located proximate the end skirt of the first insulator and extending substantially conformally around an outer surface thereof when the cover is mounted on the insulator pair arrangement and wherein the second insulator receiving passageway has a diameter and a length selected to define a mating surface at an end thereof opposite the interface chamber that is located proximate the end skirt of the second insulator and extending substantially conformally around an outer surface thereof when the cover is mounted on the insulator pair arrangement.

4. A cover for an acute angled insulator pair arrangement, the insulator pair arrangement including a first insulator and a second insulator, the insulators extending relative to each other at an acute angle from first ends thereof, the cover comprising:

a first cover member;

a second cover member configured to mate with the first cover member to define an enclosure that encloses the first ends of the insulators and a region therebetween, wherein the enclosure extends to a position proximate an end skirt of each of the insulators closest to the first ends thereof without extending over the end skirts;

an interface chamber;

a first insulator receiving passageway extending from a first edge of the enclosure to the interface chamber; a second insulator receiving passageway extending from a second edge of the enclosure to the interface chamber; and a mounting member receiving opening on a third edge of the enclosure, opposite the first and second edges, the mounting member receiving opening being configured to receive an interface member coupled to the first ends of the insulators positioned in the interface chamber when the cover is mounted on the insulator pair arrangement.

5. The cover of claim 4, further comprising a mounting member mating flange extending from the mounting member receiving opening that is configured to matingly receive a support member, the interface member being coupled to the support member.

6. The cover of claim 5, wherein the support member comprises a ground bus bar.

7. The cover of claim 4, wherein the enclosure further comprises:

a connecting flange on each of the first and second cover members extending around a portion of a periphery of the enclosure between the first and second insulator receiving passageways, between the first insulator receiving passageway and the mounting member receiving opening and/or between the second insulator receiving passageway and the mounting member receiving opening; and aligned connector receiving openings in the connecting flanges of the cover members configured to receive a connector member therethrough to connect the first and second cover members in a closed position defining the enclosure.

8. The cover of claim 7, wherein each connecting flange includes a plurality of aligned connecting receiving openings.

9. The cover of claim 4, wherein the first cover and the second cover comprise mirror image structures, each of which defines substantially half of the enclosure, half of the first insulator receiving passageway, half of the second insulator receiving passageway and half of the mounting member receiving opening.

10. The cover of claim 4, wherein the first insulator receiving passageway has a diameter and a length selected to define a mating surface at an end thereof opposite the interface chamber that is located proximate the end skirt of the first insulator and extending substantially conformally around an outer surface thereof when the cover is mounted on the insulator pair arrangement and wherein the second insulator receiving passageway has a diameter and a length selected to define a mating surface at an end thereof opposite the interface chamber that is located proximate the end skirt of the second insulator and extending substantially conformally around an outer surface thereof when the cover is mounted on the insulator pair arrangement.

11. The cover of claim 10, wherein the first and second cover members comprise a track resistant, insulating grade, ultra-violet (UV) stable polymer.

12. The cover of claim 11, wherein the first and second cover comprise unitarily molded covers.

13. The cover of claim 1, wherein the first and second cover members comprise a track resistant, insulating grade, ultra-violet (UV) stable polymer.

14. The cover of claim 1, wherein the first and second cover comprise unitarily molded covers.

15. An insulator pair arrangement comprising the cover of claim 1 and further comprising the first insulator and the second insulator and wherein the enclosure is positioned around the insulators.

16. An insulator pair arrangement comprising the cover of claim 5 and further comprising the first insulator and the second insulator and wherein the enclosure is positioned around the insulators.

17. An insulator pair arrangement comprising the cover of claim 5 and further comprising the first insulator, the second insulator, the interface member with the first ends of the insulators coupled thereto and the support member with the interface member coupled thereto, wherein the enclosure is positioned around the insulators with the interface member in the interface chamber.

18. The cover of claim 1, wherein the first and second cover members are configured to mate with an air gap therebetween.

19. The cover of claim 18, further comprising a plurality of nubs on an opposing face of the first cover member and/or the second cover member sized to provide a selected width of the air gap therebetween.

20. A cover for an acute angled insulator pair arrangement, the insulator pair arrangement including a first insulator and a second insulator, the insulators extending relative to each other at an acute angle from first ends thereof, and an interface member coupled to the first ends of the insulators, the cover comprising:

a first cover member; and a second cover member configured to mate with the first cover member to define an enclosure that encloses the first ends of the insulators and a region therebetween, wherein the enclosure extends to a position proximate an end skirt of each of the insulators closest to the first ends thereof without extending over the end skirts, wherein the enclosure does not support the insulator pair arrangement and comprises:

an interface chamber that is configured to receive the interface member and substantially none of the insulators;

a first insulator receiving passageway extending from a first edge of the enclosure to the interface chamber; and a second insulator receiving passageway extending from a second edge of the enclosure to the interface chamber, the second insulator receiving passageway extending from the interface chamber at an angle relative to the first insulator receiving passageway corresponding to the angle at which the insulators extend from the first ends thereof, wherein the insulator receiving passageways each have a length selected to receive substantially all of the first ends of the respective insulators from the interface member to the end skirts of the respective insulators.

21. A cover for an acute angled insulator pair arrangement, the insulator pair arrangement including a first insulator and a second insulator, the insulators extending relative to each other at an acute angle from first ends thereof, the cover comprising:

a first cover member; and a second cover member configured to mate with the first cover member to define an enclosure that encloses the first ends of the insulators and a region therebetween, wherein the enclosure extends to a position proximate an end skirt of each of the insulators closest to the first ends thereof without extending over the end skirts, wherein an interface between the first cover member and the second cover member extends along a length of the first insulator and the second insulator, wherein the enclosure does not support the insulator pair arrangement.

* * * * *